US009313895B2

(12) United States Patent
Ishizaka et al.

(10) Patent No.: US 9,313,895 B2
(45) Date of Patent: Apr. 12, 2016

(54) METHOD FOR FORMING COPPER WIRING

(71) Applicant: Tokyo Electron Limited, Tokyo (JP)

(72) Inventors: Tadahiro Ishizaka, Yamanashi (JP); Kenji Suzuki, Yamanashi (JP); Atsushi Shimada, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/098,465

(22) Filed: Dec. 5, 2013

(65) Prior Publication Data
US 2014/0161992 A1    Jun. 12, 2014

(30) Foreign Application Priority Data

Dec. 12, 2012  (JP) ................... 2012-271020
Mar. 27, 2013  (JP) ................... 2013-067196

(51) Int. Cl.
*H05K 3/10*        (2006.01)
*H01L 23/532*      (2006.01)
*H01L 21/285*      (2006.01)
*H01L 21/768*      (2006.01)
*H01L 21/02*       (2006.01)
*H01L 21/3105*     (2006.01)
*C23C 14/35*       (2006.01)
*H05K 1/03*        (2006.01)

(52) U.S. Cl.
CPC .............. *H05K 3/107* (2013.01); *C23C 14/358* (2013.01); *H01L 21/02063* (2013.01); *H01L 21/2855* (2013.01); *H01L 21/28556* (2013.01); *H01L 21/3105* (2013.01); *H01L 21/76814* (2013.01); *H01L 21/76826* (2013.01); *H01L 21/76846* (2013.01); *H01L 21/76855* (2013.01); *H01L 23/5329* (2013.01); *H01L 23/53238* (2013.01); *H01L 2924/0002* (2013.01); *H05K 1/0306* (2013.01); *H05K 2201/0338* (2013.01)

(58) Field of Classification Search
None
See application file for complete search history.

(56) References Cited

U.S. PATENT DOCUMENTS

| | | | |
|---|---|---|---|
| 6,417,098 B1 * | 7/2002 | Wong et al. .................. | 438/638 |
| 2003/0082301 A1 * | 5/2003 | Chen et al. ............... | 427/255.28 |
| 2004/0235311 A1 * | 11/2004 | Nakanishi et al. ............ | 438/775 |
| 2006/0105222 A1 * | 5/2006 | Abd Elhamid et al. ......... | 429/38 |
| 2008/0200002 A1 | 8/2008 | Suzuki et al. | |
| 2009/0263965 A1 | 10/2009 | Gordon et al. | |
| 2010/0200991 A1 * | 8/2010 | Akolkar et al. ............... | 257/751 |
| 2010/0323512 A1 * | 12/2010 | Matsumoto et al. .......... | 438/608 |
| 2011/0057317 A1 * | 3/2011 | Koike et al. .................. | 257/751 |
| 2013/0273250 A1 | 10/2013 | Fujimura et al. | |

FOREIGN PATENT DOCUMENTS

| | | | |
|---|---|---|---|
| JP | 2006-148075 A | 6/2006 | |
| WO | 2012-060428 A1 | 5/2012 | |

OTHER PUBLICATIONS

Suzuki, Kenji; Method of Depositing Film and Device for Plasma Deposing Film; Abstract of JP 2006-148075; Jun. 8, 2006 ; http://www19.ipdl.inpit.go.jp/.

* cited by examiner

*Primary Examiner* — Joseph Miller, Jr.

(57) ABSTRACT

There is provided a Cu wiring forming method for forming a Cu wiring by filling Cu in a recess, which is formed in a predetermined pattern in a Si-containing film of a substrate. The Cu wiring forming method includes forming a Mn film, which becomes a self-aligned barrier film by reaction with an underlying base, at least on a surface of the recess by chemical vapor deposition, forming a Cu film by a physical vapor deposition to fill the recess with the Cu film, and forming a Cu wiring in the recess by polishing the entire surface of the substrate by a chemical mechanical polishing.

5 Claims, 15 Drawing Sheets

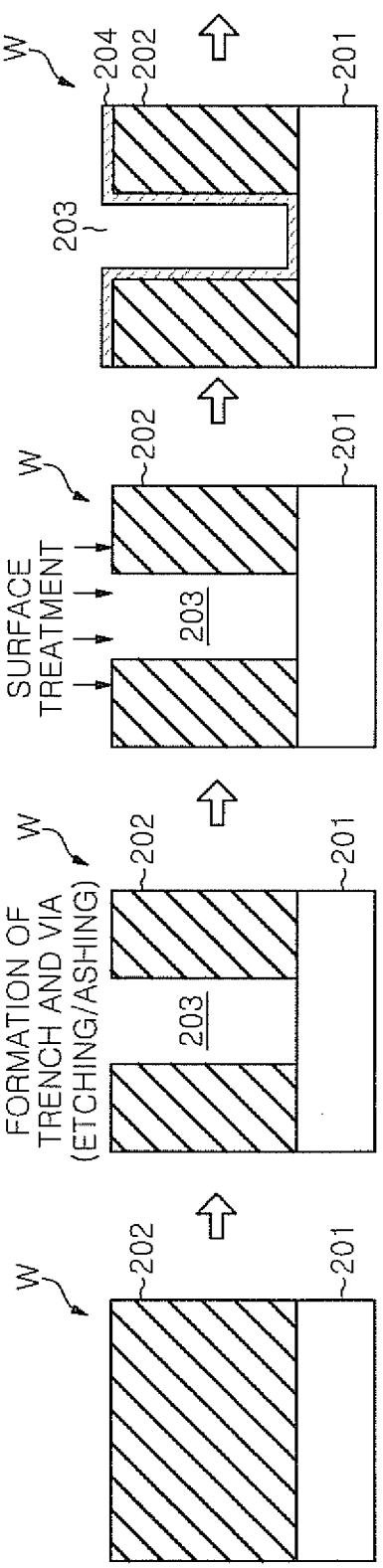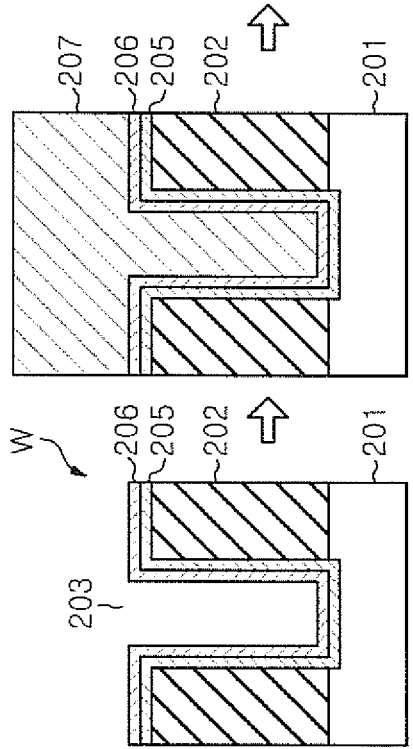

Mn+SiOx→MnSiOx

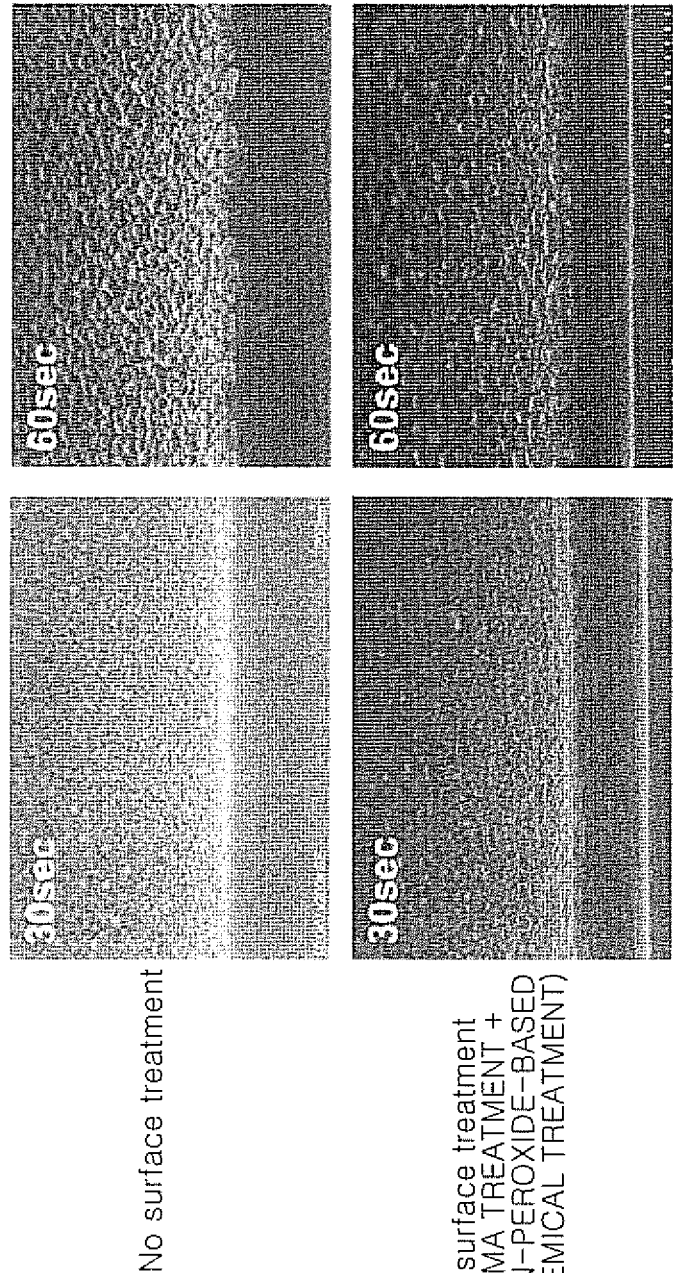

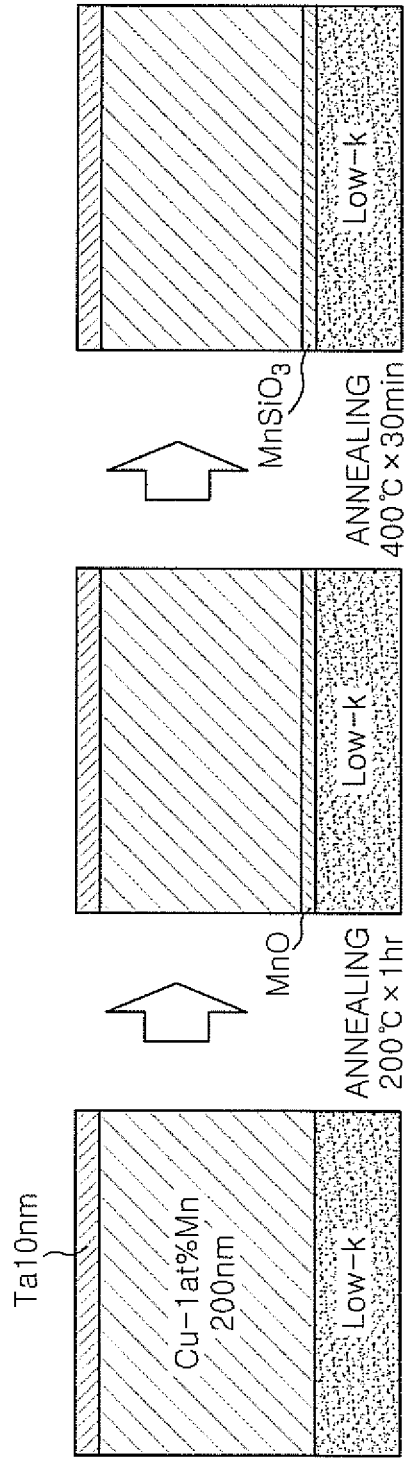

METHOD FOR FORMING COPPER WIRING

CROSS-REFERENCE TO RELATED APPLICATIONS

This application claims priority to Japanese Patent Application Nos. 2012-271020 filed on Dec. 12, 2012 and 2013-067196 filed on Mar. 27, 2013, the entire contents of which are incorporated herein by reference.

FIELD OF THE INVENTION

The present invention relates to a copper (Cu) wiring forming method for forming a copper wiring in a recess such as a trench or a hole formed on a substrate.

BACKGROUND OF THE INVENTION

Various processes such as a film formation, an etching and the like are repeatedly performed on a semiconductor wafer to manufacture a desired semiconductor device. Recently, in order to meet demands for high-speed semiconductor device, miniaturization of a wiring pattern and high level of integration, it is required to realize low resistance of wiring (high conductivity) and high electromigration resistance.

Accordingly, copper (Cu) having a higher electromigration resistance and a higher conductivity (lower resistance) than Al or W has been used as a wiring material.

As for the Cu wiring forming method, there has been proposed a technique including: forming a barrier film formed of tantalum metal (Ta), titanium (Ti), tantalum nitride (TaN), titanium nitride (TiN) or the like on an entire interlayer insulating film having a trench or a hole by a plasma sputtering as an example of a physical vapor deposition (PVD); forming a Cu seed film on the barrier film by the plasma sputtering; filling the trench or the hole by performing a Cu plating process; and removing a residual Cu thin film or a residual barrier film remaining on the wafer surface by a chemical mechanical polishing (CMP) (see, e.g., Japanese Patent Application Publication No. 2006-148075).

However, as a design rule for scaling-down of the aformendtioned semiconductor device progresses, a hole diameter or a width of a trench has reached several tens of nm, and the formation of a Cu wiring in a recess such as a narrow trench or a narrow hole leads to an increase of a wiring resistance. Further, when the trench or the hole is filled by performing the Cu plating process after the barrier film and/or the seed film are formed by the plasma sputtering as described in Japanese Patent Application Publication No. 2006-148075, the recess may not be completely filled up (poor fillability), which results in a generation of a void.

SUMMARY OF THE INVENTION

In view of the above, the present invention provides a Cu wiring forming method capable of realizing low resistance of a Cu wiring while ensuring good fillability.

The present inventors have repeatedly studied in order to solve the above problems. As a result, they have found that: the volume of the barrier film can be reduced by forming a CVD-Mn film capable of forming a self-aligned barrier film in a recess by reaction with an underlying Si-containing film; low resistance of the wiring can be realized by maximizing the volume of Cu in the wiring; and the low resistance of the wiring and good fillability can be obtained without generating a void or the like by filling the recess with Cu by the PVD.

Further, when the surface of the Si-containing film is hydrophobic, a sufficient adsorption site cannot be obtained in the case of forming a Mn film by the CVD, and it is difficult to obtain a dense and continuous Mn film. Moreover, the reaction $MnO+SiO_2 \rightarrow MnSiO_3$ which is required to form a self-aligned barrier film on the Si-containing film hardly occurs when the surface of the Si-containing film is hydrophobic. On the other hand, when surface treatment is performed on the surface of the Si-containing film such that the surface becomes hydrophilic, the adsorption of the source gas becomes better and, thus, a dense and smooth Mn film can be formed. Since Si—OH is formed on the surface of the Si-containing film when the surface treatment is carried out, the surface becomes hydrophilic and the reaction $MnO+SiO_2 \rightarrow MnSiO_3$ occurs. As a consequence, a self-aligned barrier film formed of manganese silicate is easily formed.

In accordance with an aspect of the present invention, there is provided a Cu wiring forming method for forming a Cu wiring by filling Cu in a recess, which is formed in a predetermined pattern in a Si-containing film of a substrate, the Cu wiring forming method including: forming a Mn film, which becomes a self-aligned barrier film by reaction with an underlying base, at least on a surface of the recess by chemical vapor deposition; forming a Cu film by physical vapor deposition to fill the recess with the Cu film; and forming a Cu wiring in the recess by polishing the entire surface of the substrate by chemical mechanical polishing.

In accordance with another aspect of the present invention, there is provided a storage medium storing a program executed on a computer to control a Cu wiring forming system, wherein the program, when executed on the computer, controls the Cu wiring forming system to perform the Cu wiring forming method described above.

BRIEF DESCRIPTION OF THE DRAWINGS

The objects and features of the present invention will become apparent from the following description of embodiments, given in conjunction with the accompanying drawings, in which:

FIGS. 2A to 2H are process cross sectional views for explaining the Cu wiring forming method in accordance with the embodiment of the present invention;

FIG. 6 shows SEM images illustrating film states obtained in the case of forming a Mn film without performing a surface treatment on the interlayer insulating film (Low-k film) and in the case of forming a Mn film after performing a treatment using hydrogen-peroxide-based liquid chemical as the surface treatment for hydrophilization;

FIGS. 7A to 7C explain processes of forming a sample for examining adhesivity;

DETAILED DESCRIPTION OF THE EMBODIMENTS

Hereinafter, embodiments of the present invention will be described in detail with reference to the accompanying drawings which form a part hereof.

<Embodiment of Cu Wiring Forming Method>

Figure 1:
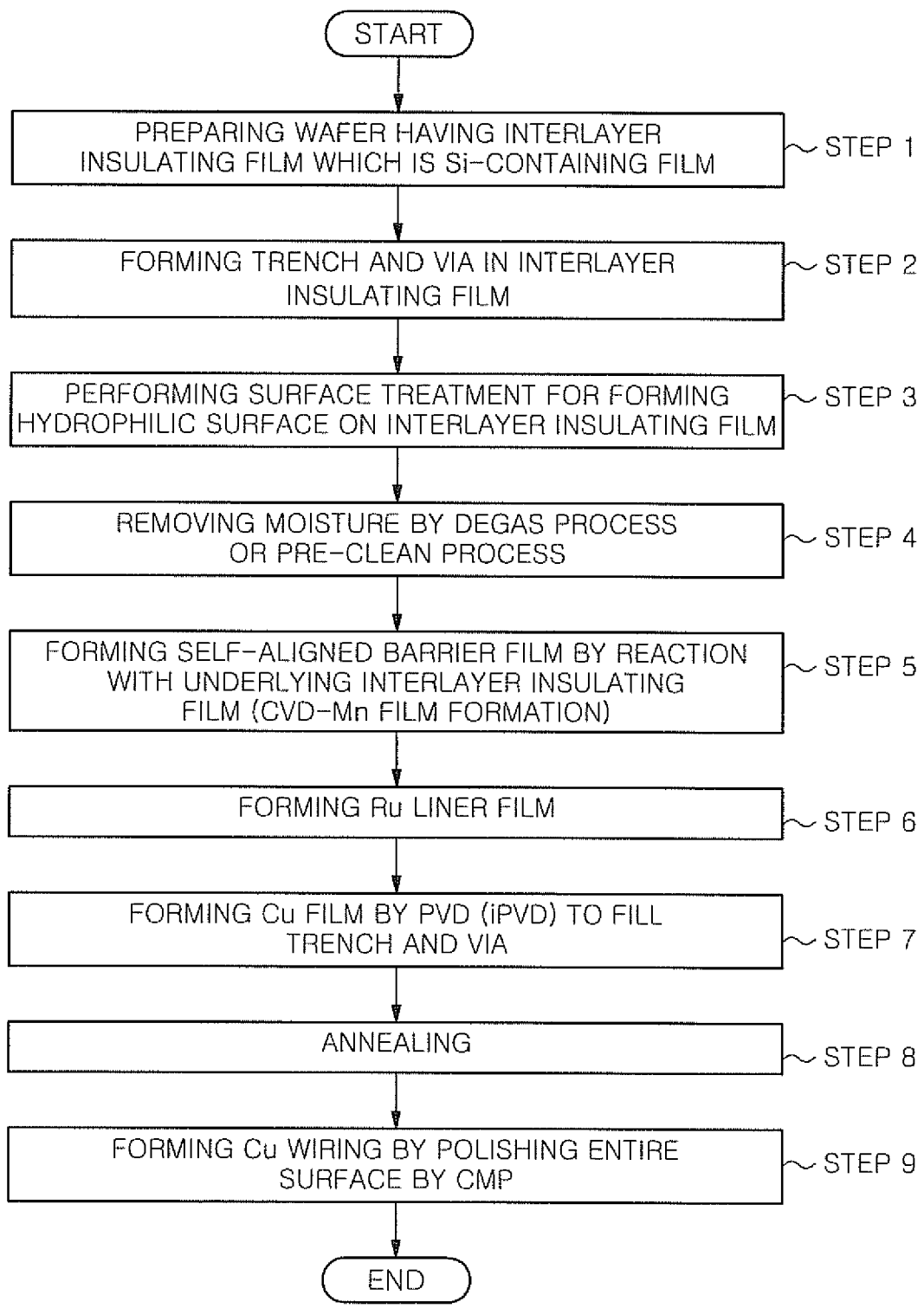
FIG. 1 is a flowchart showing a Cu wiring forming method in accordance with an embodiment of the present invention.

A Cu wiring forming method in accordance with an embodiment of the present invention will be described with reference to a flowchart shown in FIG. 1 and a process cross sectional view shown in FIGS. 2A to 2H.

In the present embodiment, first, there is prepared a semiconductor wafer (hereinafter, simply referred to as "wafer") W including: a base structure 201 (detailed description is omitted) including an underlying Cu wiring; and an interlayer insulating film 202 that is a Si-containing film such as a $SiO_2$ film, a Low-k film (SiCO, SiCOH or the like) or the like formed on the base structure 201 (step 1, FIG. 2A).

Next, a trench 203 and a via (not shown) for connection to the underlying wiring are formed in a predetermined pattern by etching the interlayer insulating film, and the photoresist serving as an etching mask is removed by ashing (step 2, FIG. 2B).

Next, the surface treatment for forming a hydrophilic surface is performed on the interlayer insulating film 202 after the formation of the trench 203 and the via (step 3, FIG. 2C).

Then, if necessary, moisture is removed from the surface of the insulating film by a degas process or a pre-clean process (step 4, not shown in FIG. 2). Thereafter, a Mn film 204 for forming a barrier film for suppressing diffusion of Cu is formed on the entire surface including the surface of the via and the trench 203 by a chemical vapor deposition (CVD) (step 5, FIG. 2D).

Next, a Ru liner film 206 is formed on the barrier film 205 formed by reaction between the Mn film 204 and the underlying interlayer insulating film 202 (step 6, FIG. 2E). The film formation at this time is preferably performed by the CVD.

Then, the Cu film 207 is formed by a physical vapor deposition (PVD) to fill the trench 203 and the via (not shown) (step 7, FIG. 2F). The film formation at this time is preferably performed by an ionized physical vapor deposition (iPVD), e.g., a plasma sputtering. Further, the Cu film 207 is preferably laminated beyond an upper end of the trench 203 for a planarization process to be performed later. However, such a laminated portion may be formed by a plating process, instead of consecutive formation by the PVD.

Next, an annealing is performed when necessary (step 8, FIG. 2G). By performing the annealing, the Cu film 207 is stabilized. Further, this stabilization is carried out when the barrier film 205 formed of manganese silicate is formed insufficiently.

Thereafter, the entire surface of the wafer W is polished by a chemical mechanical polishing (CMP), and is planarized by removing the Cu film 207, the Ru liner film 206, the barrier film 205 which are laminated on the interlayer insulating film 202 (step 9, FIG. 2H). Accordingly, a Cu wiring 208 is formed in the trench and the via (hole).

After the Cu wiring 208 is formed, a proper cap film such as a dielectric cap, a metal cap or the like is formed on the entire surface including the Cu wiring 208 on the surface of the wafer W and the interlayer insulating film 202.

Hereinafter, main processes among the above series of processes will be described in detail.

The surface treatment in the step 3 is performed to ensure an adsorption site of a source gas in the case of forming a Mn film 204 by the CVD in the step 4.

Figure 3:
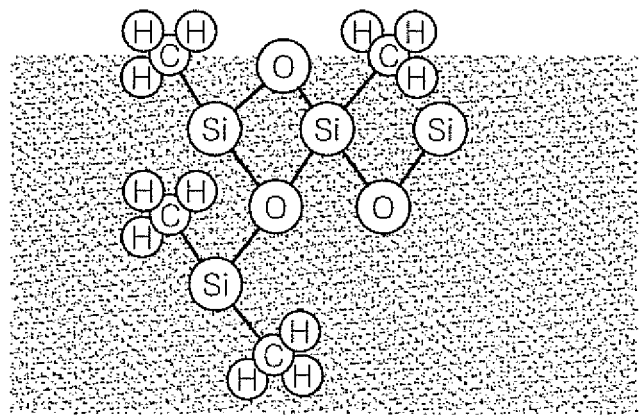
FIG. 3 explains a hydrophobic surface of an interlayer insulating film (Low-k film)

The interlayer insulating film 202 as the Si-containing film generally has a hydrophobic surface. Particularly, as shown in FIG. 3, the Low-k film is terminated with a methyl group (—$CH_3$) which is a hydrophobic group, and the surface has a high hydrophobic property. When the surface is hydrophobic, the source gas for forming a Mn film is not easily adsorbed and nucleation is insufficient. Therefore, a film grows in an island shape, and it is difficult to form a dense and continuously smooth thin film. In view of realization of low resistance of wiring, the Mn film 204 needs to have a considerably thin thickness of 2 nm or less. However, when a film grows in an island shape, it is difficult to form such a thin film.

Figure 4:
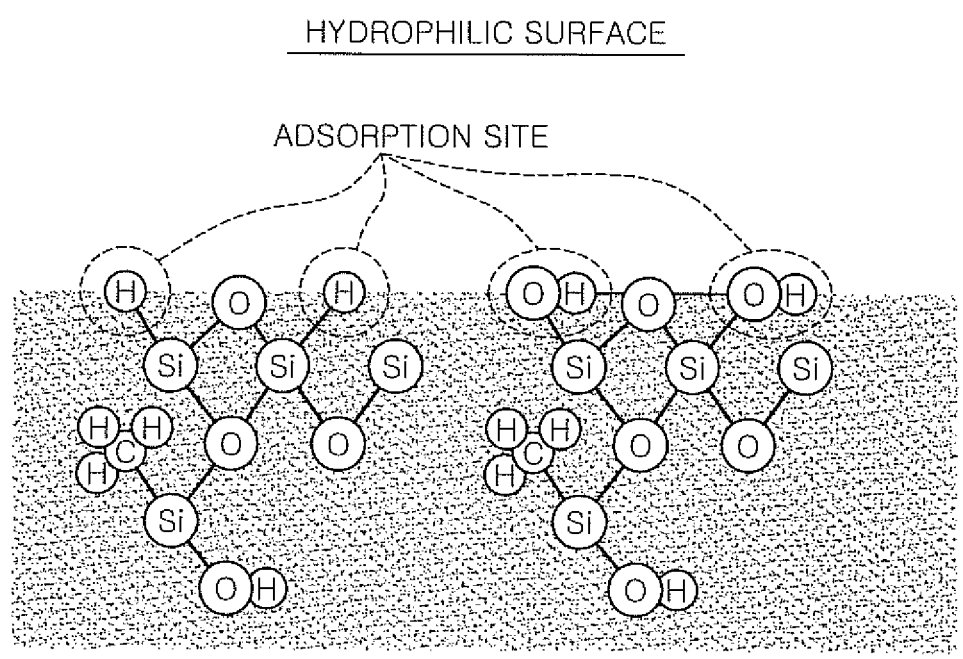
FIG. 4 explains a hydrophilic surface in the case of performing hydrophilic treatment on the interlayer insulating film (Low-k film)

Therefore, the surface treatment is performed on the surface of the interlayer insulating film 202 as a Si-containing film, e.g., the surface of the Low-k film, so that the surface becomes hydrophilic. Accordingly, the methyl group (—$CH_3$) on the surface is replaced with, e.g., H group (—H) or OH group (—OH), as shown in FIG. 4. As a result, the hydrophobic surface is changed to the hydrophilic surface, so that the surface becomes activated. In addition, a dipole moment of Si—$CH_3$ is 0.8759, whereas a dipole moment of Si—OH is 1.3339, which is higher and more activated. Therefore, the source gas is easily adsorbed (—H and —OH become adsorption sites), and the nucleation site of Mn is increased. This enables the nucleation density on the surface of the interlayer insulating film 202 to be increased, which leads to formation of a dense and continuously smooth Mn film. As a consequence, a thin and dense Mn film 204 can be formed. Further, the hydrophilic surface may have an NH group (—NH).

In order to form a self-aligned barrier film on the Si-containing film, thermodynamical reaction MnO+$SiO_2 \rightarrow MnSiO_3$ is required. For this reaction to occur, a Mn film or a MnO film is formed on the interlayer insulating film 202 as a Si-containing film by the CVD. Since, however, a Mn oxide includes $Mn_3O_4$, $Mn_2O_3$, $MnO_2$, in addition to MnO, $H_2$ is required for $Mn_3O_4$, $Mn_2O_3$, $MnO_2$ to thermodynamically stabilize MnO and Mn and, further, this reaction hardly occurs when the surface of the interlayer insulating film 202 is terminated with a methyl group (—$CH_3$), which is a hydrophobic group, and has a hydrophobic property. In contrast, when Si—OH is present on the surface of the Si-containing film, the surface of the interlayer insulating film 202 becomes hydrophilic, which makes it possible to form a dense and smooth Mn film. Besides, the above reaction easily occurs, so that the self-aligned barrier film is easily formed.

The surface treatment performed on the surface of the interlayer insulating film 202 preferably includes a treatment using liquid chemical containing hydrogen peroxide (hydrogen peroxide-based liquid chemical). Such treatment may be performed by submerging the wafer W into, e.g., hydrogen peroxide-based liquid chemical. By performing this treatment, an OH group is easily formed by reaction between the hydrogen peroxide in the liquid chemical and the hydrophobic group on the surface of the interlayer insulating film 202, thereby considerably increasing the adsorptivity of the source gas. Accordingly, the nucleation of Mn on the surface is considerably increased, and a dense and continuously smooth Mn film is easily formed. Further, this treatment enables Si—OH to be formed on the surface of the interlayer insulating film 202 as a Si-containing film. Therefore, the reaction $MnO + SiO_2 \rightarrow MnSiO_3$ easily occurs, and a self-aligned barrier film is easily formed.

The surface treatment may include $N_2$ plasma treatment also having a function of removing residue. By performing the $N_2$ plasma treatment, the etching residue is removed, and an NH group (—NH) is formed on the surface of the interlayer insulating film 202, thereby forming a hydrophilic surface. Accordingly, the source gas is easily adsorbed and the nucleation density is increased, which makes it possible to form a dense and continuously smooth Mn film.

The $N_2$ plasma treatment may be performed alone, but the effect of increasing the nucleation density is higher when using the hydrogen peroxide-based liquid chemical treatment. Further, when the $N_2$ plasma treatment is performed alone, Si—OH that facilitates the reaction $MnO + SiO_2 \rightarrow MnSiO_3$ is not formed. Therefore, it is preferable to perform the hydrogen peroxide-based liquid chemical treatment after the $N_2$ plasma treatment in order to remove residue, make the surface of the interlayer insulating film 202 hydrophilic and easily form a self-aligned barrier film by forming Si—OH on the surface of the interlayer insulating film 202.

This surface treatment preferably includes a treatment using a compound having O—Si—OH in its structure. By performing the treatment using such a compound, Si—OH can be formed on the surface of the interlayer insulating film 202 as a Si-containing film, and the surface of the interlayer insulating film 202 can become hydrophilic. Besides, the reaction $MnO + SiO_2 \rightarrow MnSiO_3$ can be facilitated.

The compound having O—Si—OH in its structure may include, e.g., tris(tert-butoxy)silanol (TBOSL; $((CH_3)_3CO)_3SiOH$), tris(tert-pentoxy)silanol (TPOSL; $(CH_3CH_2C(CH_3)_2O)_3SiOH$), and tris(isopropoxy) silanol (TIPOSL; $((CH_3)_2CHO)_3SiOH$). The structural formulas thereof will be described below.

<Chemical formula 1>

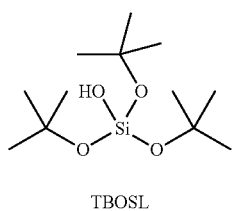

TBOSL

<Chemical formula 2>

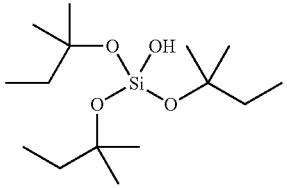

TPOSL

<Chemical formula 3>

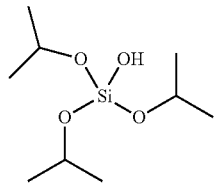

TIPOSL

The surface treatment using a compound having O—Si—OH in its structure may be performed by using liquid chemical containing such a compound, or may be performed by using gas containing such a compound.

The above-described surface treatment may include another plasma treatment such as $O_2$ plasma treatment or the like, and/or another liquid chemical treatment.

The surface treatment processes only the surface of the interlayer insulating film 202 without inflicting damage into the film. For example, when the interlayer insulating film 202 is a Low-k film and inside of the film becomes hydrophilic, the dielectric constant of the film is increased. However, if only the surface is processed, the dielectric constant is not increased. In order to process the surface only, processing time or the like needs to be set such that the inside of the film is prevented from becoming hydrophilic. When $O_2$ plasma treatment is used as the surface treatment, the reactivity is high and, thus, the condition setting is significant.

Next, the Mn film 204 and the barrier film 205 will be described.

Figure 5A:
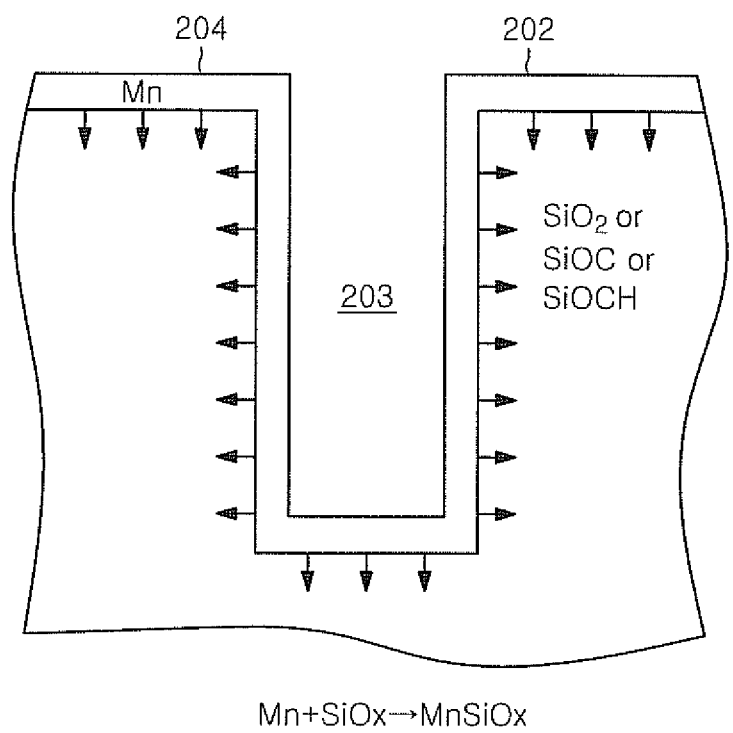
FIGS. 5A and 5B explain a mechanism for forming a Mn film in a trench to form a self-aligned barrier film by reaction with an interlayer insulating film of a base.
Figure 5B:
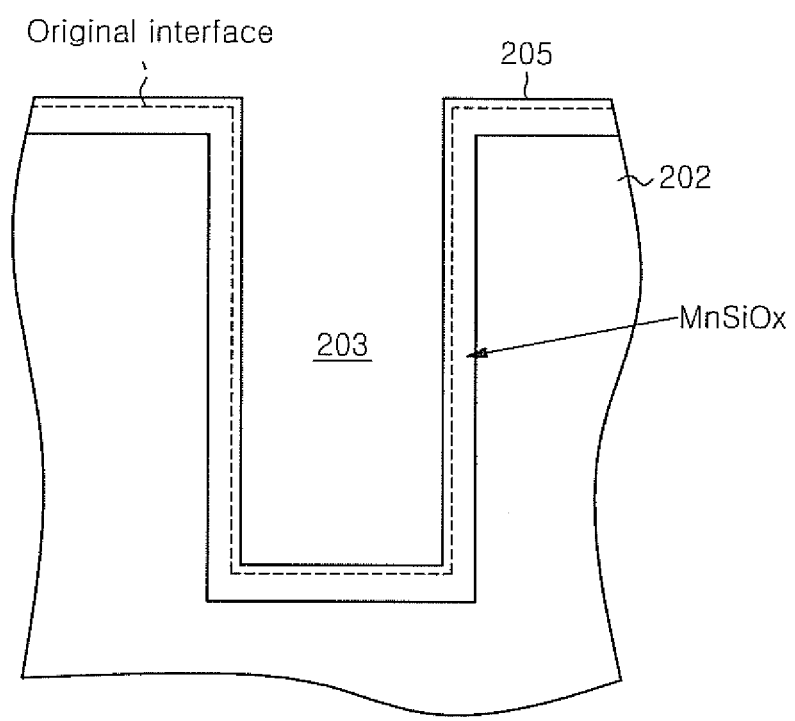

The Mn film 204 is formed by the chemical vapor deposition (CVD) as described above. Further, it may be also formed by an atomic layer deposition (ALD), which is similar to the CVD. Mn reacts with underlying Si by heat applied when a Mn film is formed by the CVD, and a self-aligned barrier film 205 formed of manganese silicate (MnSiOx (here, x being 3 or 4)) can be formed. If the heat applied for the Mn film formation is insufficient, then heat applied thereafter (e.g., heat applied when performing an annealing) is added thereto to make such a reaction. In other words, the Mn film 204 reacts with Si contained in the underlying interlayer insulating film 202, as shown in FIG. 5A, so that the barrier film 205 can be formed at the underlying interlayer insulating film 202 as shown in FIG. 5B. Accordingly, the volume of the barrier film in the recess such as a hole or a trench can be reduced, and the volume of the barrier film in the recess can become close to zero. This increases the volume of Cu in the wiring, so that the low resistance of the wiring can be realized.

In the case of using the Low-k film for the interlayer insulating film 202, the interlayer insulating film 202 is terminated with a methyl group (—$CH_3$) as a hydrophobic group, and the surface thereof has a high hydrophobic property. Further, the reaction $MnO + SiO_2 \rightarrow MnSiO_3$ that forms a self-aligned barrier film hardly occurs. However, by performing the surface treatment that forms Si—OH on the surface as described above, the above reaction easily occurs, so that a self-aligned barrier film formed of manganese silicate is effectively formed.

In view of increasing the volume of Cu in the wiring, the Mn film 204 preferably has a thin thickness, e.g., 2 nm or less.

When the Mn film is formed by CVD, the film formation is carried out by supplying and thermally decomposing a manganese compound gas on the wafer, or by supplying a manganese compound gas and a reduction gas on the wafer and then reducing the manganese compound gas by the reduction gas.

As for the manganese compound gas, a carbonyl-based manganese compound such as decacarbonyldimanganese ($Mn_2(CO)_{10}$) or methylcyclopentadienyl tricarbonyl manganese (($CH_3C_5H_4)Mn(CO)_3$) may be properly used. Particularly, $Mn_2(CO)_{10}$ has a simple structure, so that a Mn film having reduced amount of impurities can be formed. Moreover, in the case of forming a Ru liner film 206 by the CVD using a carbonyl-based ruthenium compound as will be described later, it is particularly preferable to use the aforementioned carbonyl-based manganese compounds.

In addition, it is possible to properly use a cyclopentadienyl-based manganese compound such as bis(alkyl cyclopentadienyl)manganese expressed as a general formula $Mn(RC_5H_4)_2$, a beta diketone-based manganese compound such as bis(dipivaloylmethanato)manganese ($Mn(C_{11}H_{19}O_2)_2$), an amidinate-based manganese compound such as bis(N,N'-dialkyl acetoamidinate)manganese expressed as a general formula $Mn(R^1N—CR^3—NR^2)_2$ which is disclosed in U.S. Patent Application Publication No. US2009/0263965A1, or an amido amino alkane-based manganese compound such as bis(N,N'-1-alkylamido-2-dialkylaminoalkane)manganese expressed as a general formula $Mn(R^1N—Z—NR^2_2)_2$ which is disclosed in International Application Publication No. WO2012/060428. Here, R, $R^1$, $R^2$, and $R^3$ indicate alkyl groups expressed as $—C_nH_{2n+1}$ (n being an integer greater than or equal to 0), and Z indicates an alkylene group expressed as (n being an integer greater than or equal to 0). In view of low-temperature film formation, it is preferable to use an amido amino alkane-based manganese compound.

As for the reduction gas, it is possible to use $H_2$ gas, CO gas, aldehyde (R—CHO) gas such as formaldehyde (HCHO) or the like, carboxylic acid (R—COOH) gas such as formic acid (HCOOH) or the like.

The film forming temperature is in a range from 250° C. to 400° C. in the case of using a carbonyl-based manganese compound, in a range from 250° C. to 300° C. in the case of using an amido amino alkane-based manganese compound, and in a range from 350° C. to 400° C. in the case of using an amidinate-based manganese compound. Further, the pressure in the processing chamber during the film formation is in a range from 1.33 Pa to 133 Pa.

Next, a Ru liner film 206 will be described.

Since Ru has high wettability to Cu, forming the Ru liner film at the base of Cu ensures good mobility of Cu in forming a Cu film by the iPVD, which can suppress the formation of an overhang which blocks an opening of the trench or the hole. Therefore, Cu can be reliably filled even in a fine trench or hole without forming a void therein.

In order to realize a low resistance of wiring by increasing the volume of Cu filled in the trench or the hole, the Ru liner film preferably has a thin thickness in a range from 1 nm to 5 nm.

The Ru liner film 206 is preferably formed by a thermal CVD while using $Ru_3(CO)_{12}$ as a film forming material. Accordingly, a thin Ru film having high purity can be formed with a high step coverage. The film forming conditions are as follows: a pressure in the processing chamber ranging from 1.3 Pa to 66.5 Pa; and a film forming temperature (wafer temperature) ranging from 150° C. to 250° C. The Ru liner film 206 may be formed by the PVD or the CVD using another film forming material other than $Ru_3(CO)_{12}$, such as a ruthenium pentadienyl compound, e.g., (cyclopentadienyl) (2,4-dimethylpentadienyl)ruthenium, bis(cyclopentadienyl) (2,4-methylpentadienyl)ruthenium, (2,4-dimethylpentadienyl)(ethylcyclopentadienyl)ruthenium, or bis(2,4-methylpentaenyl)(ethylcyclopentadienyl)ruthenium.

Further, when the opening of the trench or the via is wide and the overhang is hardly formed, it is not necessary to form the Ru liner film 206, and the Cu film may be directly formed on the barrier film 205.

Next, the formation of the Cu film 207 will be described.

The Cu film 207 is formed by the PVD. However, The Cu film 207 is preferable formed by the iPVD, e.g., plasma sputtering.

In the conventional PVD film formation, the overhang that blocks (covers) the opening of the trench or the hole is likely to be formed due to agglomeration of Cu. However, when the iPVD is used to control the film formation by Cu ions and the etching by ions (Ar ions) of the plasma generation gas while adjusting the bias power applied to the wafer, the formation of the overhang can be suppressed due to the moving Cu. Accordingly, good fillability can be obtained even in a trench or a hole having a narrow opening. At this time, it is preferable to perform a high-temperature process (in a temperature ranging from about 65° C. to 350° C.) in which Cu is migrated in order to ensure mobility of Cu and obtain good fillability. Further, as described above, by providing the Ru liner film 206 having high wettability to Cu at the base of the Cu film 207, Cu moves without agglomeration on the Ru liner film. Accordingly, the formation of overhang can be suppressed even in the fine recess, and Cu can be reliably filled therein without forming a void.

When the overhang is hardly formed due to a large opening width of a trench or a hole, the film formation can be performed at a high speed by a low-temperature process (in a temperature ranging from −50° C. to 0° C.) in which the migration of Cu does not occur.

Further, a pressure in the processing chamber (processing pressure) during the formation of the Cu film is preferably in a range from 1 mTorr to 100 mTorr (from 0.133 Pa to 13.3 Pa) and more preferably in a range from 35 mTorr to 90 mTorr (from 4.66 Pa to 12.0 Pa).

In accordance with the present embodiment, a CVD-Mn film capable of forming a self-aligned barrier film by reaction with Si of the interlayer insulating film 202 is formed in the trench 203 and the hole in the interlayer insulating film 202 as a Si-containing film. Thus, the volume of the barrier film 205 is reduced, and the volume of Cu in the wiring is maximized. Accordingly, the low resistance of the wiring can be realized. Further, since the Cu wiring is formed by filling the Cu film in the trench and the hole by the PVD, the generation of a void, which may occur in the case of filling Cu by a plating process, can be prevented. Therefore, both of the low resistance of the wiring and the good fillability can be realized.

Further, before the Mn film is formed, the surface treatment is performed on the surface of the interlayer insulating film 202 such that the surface becomes a hydrophilic surface. Therefore, when the CVD-Mn film is formed, the adsorption of the source gas is improved, which makes it possible to form a dense and smooth Mn film.

By performing, as the surface treatment, the treatment that forms hydrophilic Si—OH on the surface of the interlayer insulating film 202 such as the hydrogen peroxide-based liquid chemical treatment or the treatment using a compound having O—Si—OH in its structure, it is possible to obtain the effects in which the reaction $MnO+SiO_2 \rightarrow MnSiO_3$ easily occurs and a self-aligned barrier film is easily formed in addition to the effect in which a dense and smooth Mn film is formed.

Next, the tests that have examined the effect obtained by actually performing the surface treatment will be explained.

<Test 1>

In this test, a Low-k film (SiCOH; k=2.4) was used as the interlayer insulating film. A sample in which the surface treatment was not performed on a surface of the Low-k film and a sample in which $N_2$ plasma treatment and hydrogen peroxide-based liquid chemical were sequentially performed on the surface of the Low-k film were subjected to a degas process at 265° C. Thereafter, a Mn film was formed at 300° C. by the CVD using decacarbonyldimanganese ($Mn_2(CO)_{10}$).

FIG. 6 shows scanning electron microscope (SEM) images obtained 30 and 60 seconds after the formation of the Mn film was started. As shown in FIG. 6, when the surface treatment for hydrophillization was not performed, Mn particles were large and the surface was rough. Moreover, a continuously smooth film was not obtained. On the contrary, when the surface treatment for hydrophllization was performed, particles were fine, and a dense and continuously smooth film was obtained.

<Test 2>

In this test, a Low-k film (SiCOH; k=2.4) was used as the interlayer insulating film as shown in FIGS. 7A to 7C. There were prepared a sample in which the surface treatment was not performed on the surface of the Low-k film and a sample in which the surface treatment for submerging the Low-k film in TBOSL liquid chemical was performed. On both samples, a Cu-1 at % Mn alloy film having a thickness of 200 nm was formed by the PVD and, then, a Ta film having a thickness of 10 nm was formed thereon by the PVD. These samples were annealed at 200° C. for one hour, and MnO was formed between the Low-k film and the Cu—Mn alloy film. Next, the annealing was performed at 400° C. for 30 minute in order to form a self-aligned barrier.

Next, a tape peel test was performed on the samples in order to evaluate adhesivity of the film after the annealing at 200° C. and 100° C. The tape peel test was carried out by a cross-cut test method. The results thereof are shown in Table 1.

TABLE 1

|  | No surface treatment | Surface treatment using TBOSL liquid chemical |
|---|---|---|
| 200° C. × 1 hr only | Completely peeled | Completely peeled |
| 200° C. × 1 hr + 400° C. × 30 min | Scales remained extremely partially | More than half remained |

As shown in Table 1, when the surface treatment was not performed on the surface of the Low-k film, scales remained extremely partially even after the annealing at 400° C. for forming a self-aligned barrier, and the adhesivity was insufficient. On the other hand, when the surface treatment for submerging the Low-k film in the TBOSL liquid chemical was performed, more than half remained without being peeled off after the annealing at 400° C. These results show that the barrier film formed of manganese silicate (MnSiOx) was formed on the interface by performing the annealing after the surface treatment for submerging the low-k film in the TBOSL liquid chemical.

Next, the barrier properties in the case of performing the treatment using TBOSL and in the case of not performing the treatment using TBOSL were examined by secondary ion analysis in a depth direction.

Figure 8A:
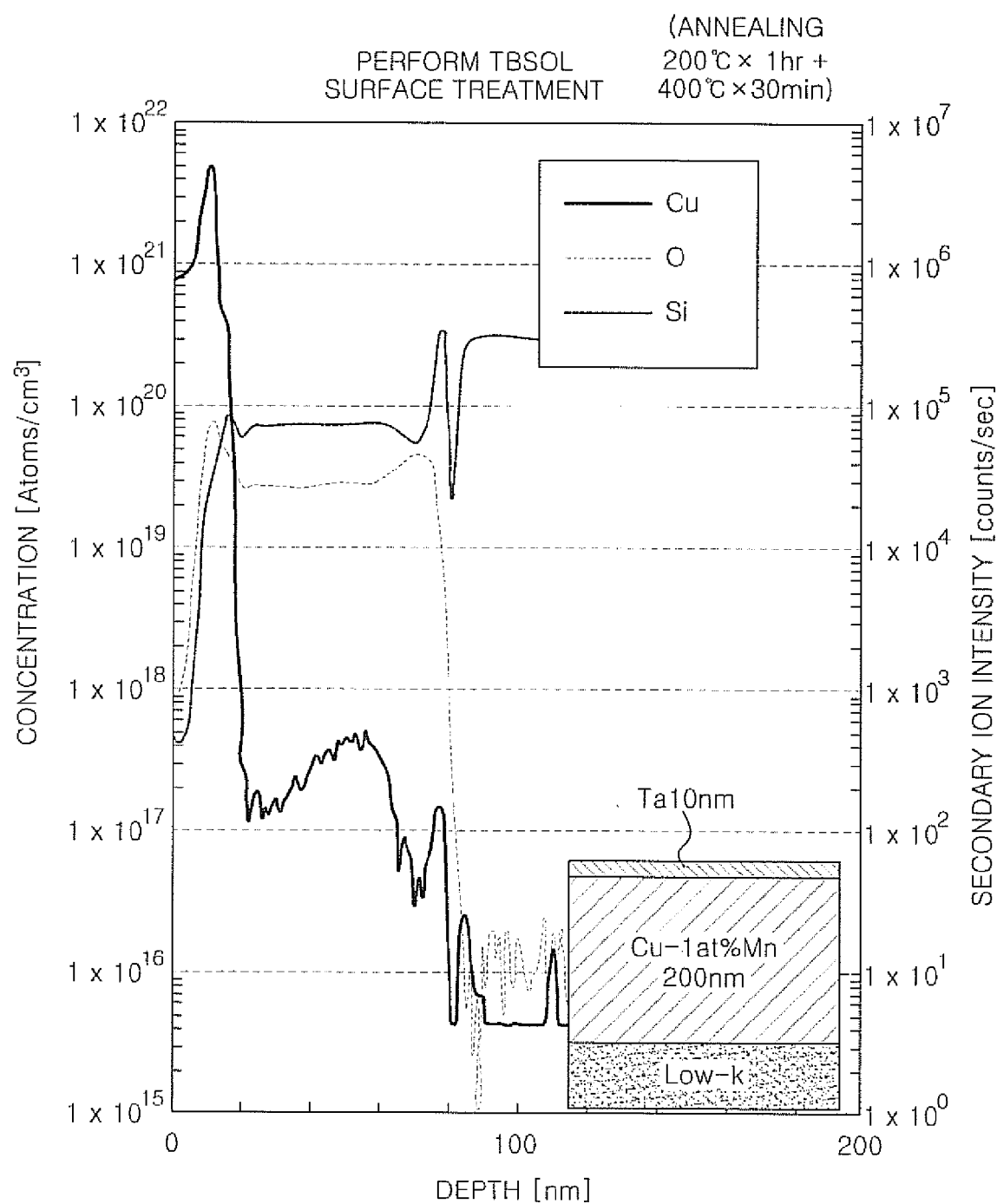
FIGS. 8A and 8B show secondary ion analysis results for comparing a barrier property between a sample obtained by performing TBOSL liquid chemical treatment as the surface treatment for hydrophilization on the interlayer insulating film (Low-k film), forming a Cu—Mn alloy film, and then performing annealing and a sample obtained by forming a Cu—Mn alloy film without performing the surface treatment and then performing annealing.
Figure 8B:
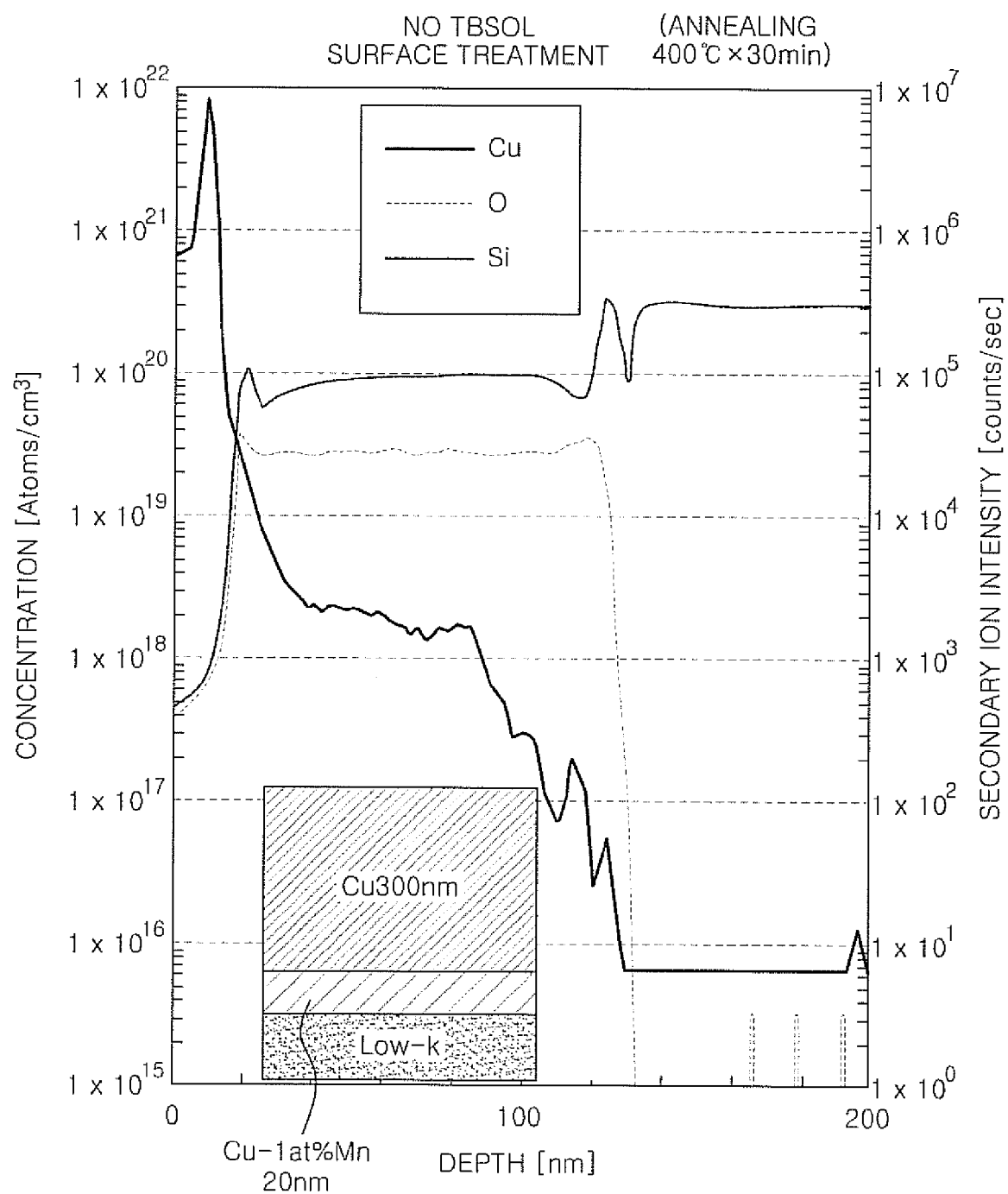

The results thereof are shown in FIGS. 8A and 8B. FIG. 8A shows a result obtained by annealing a sample at 200° C. for one hour and then at 400° C. for 30 minute, the sample being obtained by performing the surface treatment for submerging the low-k film in TBOSL liquid chemical on the surface of the Low-k film, forming a Cu-1 at % Mn alloy film having a thickness of 200 nm by the PVD, and forming a Ta film having a thickness of 10 nm thereon by the PVD. FIG. 8B shows a result obtained by annealing a sample at 400° C. for 30 minute, the sample being obtained by forming a Cu-1 at % Mn alloy film having a thickness of 20 nm by the PVD and forming a Cu film having a thickness of 300 nm thereon by the PVD without performing the surface treatment on the surface of the Low-k film. From the above, it is clear that the barrier property is improved by performing the annealing after the surface treatment for submerging the low-k film in TBOSL liquid chemical.

These results show the barrier property to the Cu film is improved by forming a barrier film formed of manganese silicate (MnSiOx) on the interface by performing the annealing after the surface treatment for submerging the low-k film in TBOSL liquid chemical on the surface of the Low-k film.

Among the above series of processes, the step 5 of forming the Mn film 204, the step 6 of forming the Ru liner film 206, and the step 7 of forming the Cu film 207 are preferably performed consecutively in vacuum without being exposed to the atmosphere. However, the exposure to the atmosphere may occur between the above steps.

<Film Forming System Suitable for Implementation of an Embodiment of the Present Invention>

Figure 9:
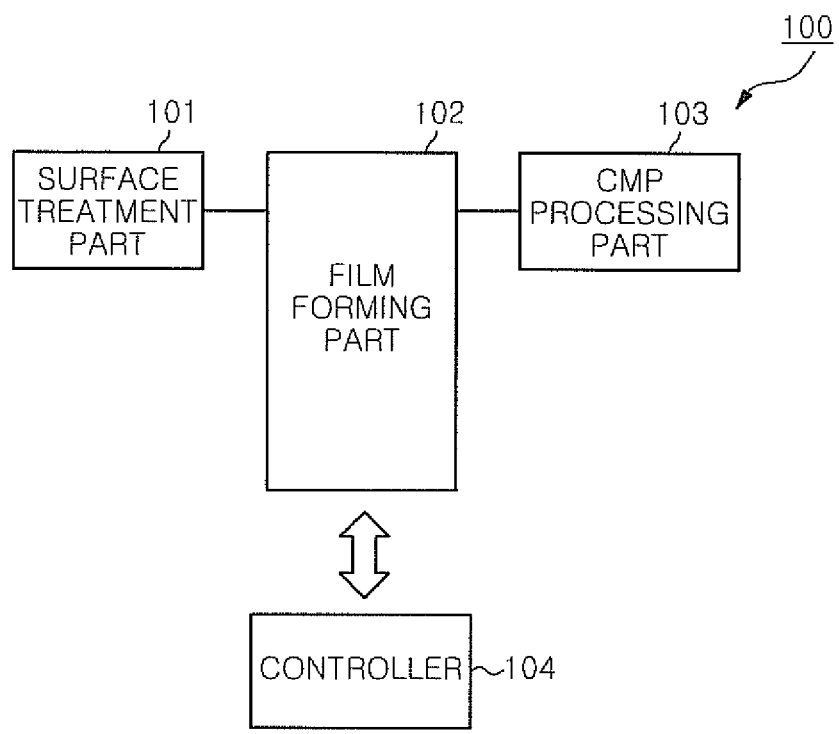
FIG. 9 is a block diagram showing a schematic configuration of a film forming system used in the Cu wiring forming method in accordance with an embodiment of the present invention.
Figure 10:
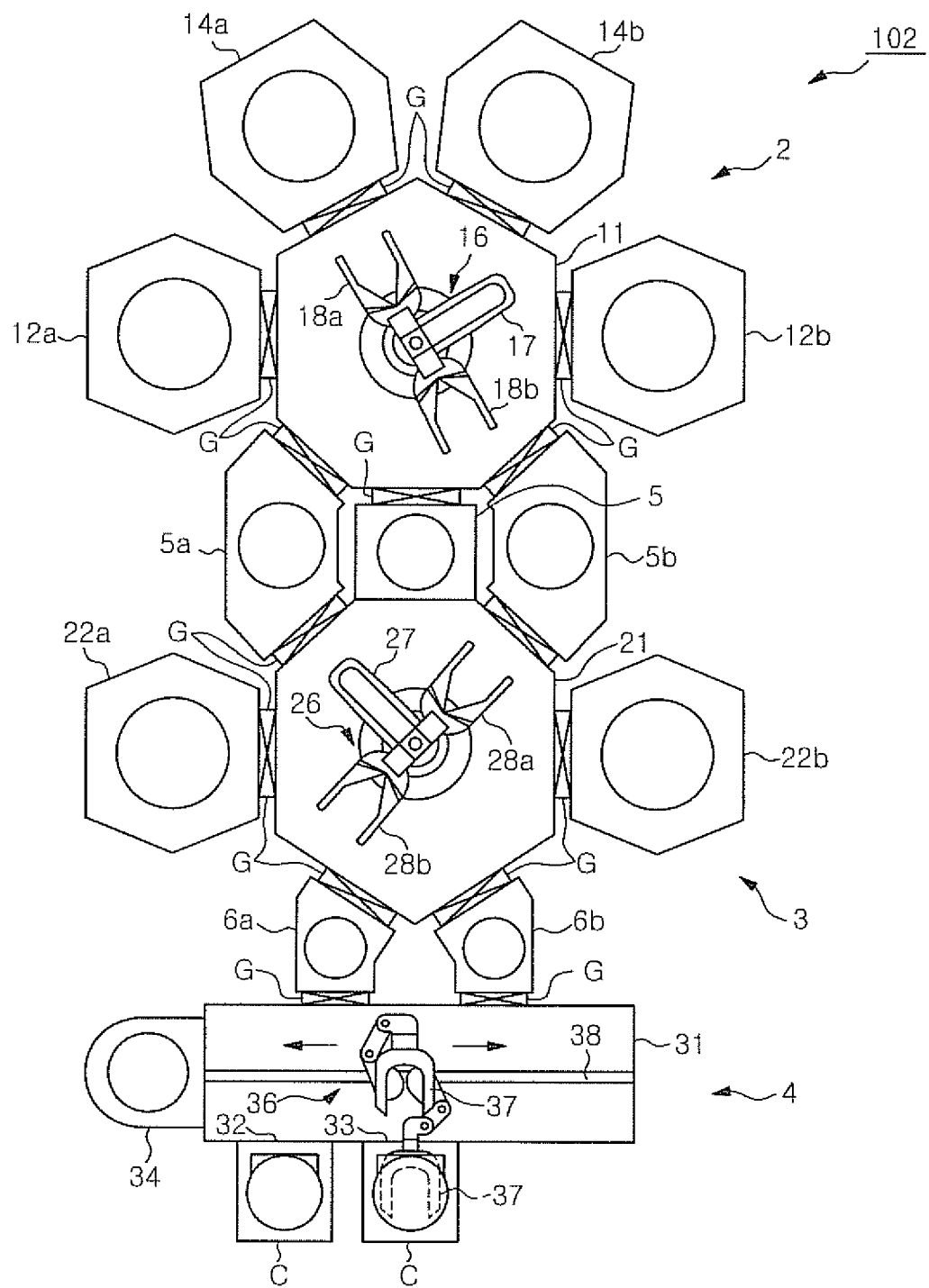
FIG. 10 is a top view showing a film forming part of the film forming system shown in FIG. 9.
Figure 11:
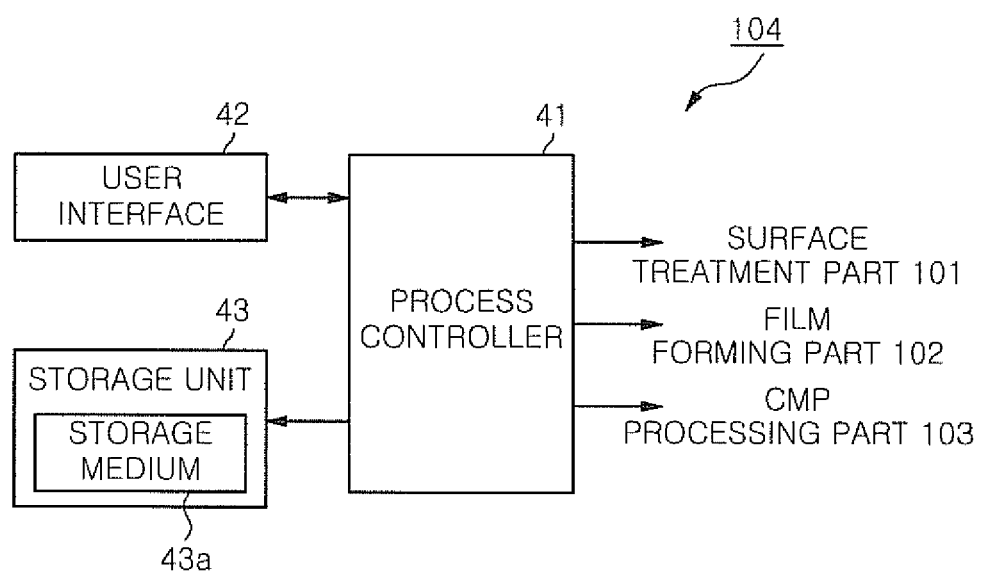
FIG. 11 is a block diagram showing a controller of the film forming system shown in FIG. 9.

Hereinafter, a film forming system suitable for implementation of the Cu wiring forming method in accordance with an embodiment of the present invention will be described. FIG. 9 is a block diagram showing a schematic configuration of the film forming system. FIG. 10 is a top view showing an example of a multi-chamber type film forming apparatus forming a film forming part shown in FIG. 9. FIG. 11 is a block diagram showing a controller shown in FIG. 9.

As shown in FIG. 9, a film forming system 100 includes a surface treatment part 101 for performing a surface treatment for forming a hydrophilic surface on the interlayer insulating film, a film forming part 102 for performing a film forming process thereafter, a CMP processing part for performing a CMP processing, and a controller 104 for controlling the respective components of the film forming system 100.

The surface treatment part 101 for performing the above-described surface treatment includes a hydrogen peroxide-based liquid chemical processing apparatus or a $N_2$ plasma treatment apparatus, or both of the apparatuses. Alternatively, the surface treatment part 101 includes a processing apparatus for performing the treatment using a compound having O—Si—OH in its structure, transfer devices thereof or the like.

The film forming part 102 includes a first processing unit 2 for forming a barrier film and a Ru liner film, a second processing unit 3 for forming a Cu film, and a loading/unloading unit 4. The film forming part 102 is provided for use in a Cu wiring formation on a wafer W, and it is particularly provided to perform processes up to the formation of the Cu film in the above embodiment.

The first processing unit 2 has a first vacuum transfer chamber 11 having a heptagonal cross section, and two Mn film forming apparatuses 12a and 12b and two Ru liner film forming apparatuses 14a and 14b which are connected to walls corresponding to four sides of the first vacuum transfer chamber 11. The Mn film forming apparatus 12a and the Ru liner film forming apparatus 14a are disposed in line symmetry with the Mn film forming apparatus 12b and the Ru liner film forming apparatus 14b.

Degas chambers 5a and 5b each for performing a degas process on the wafer W are connected to walls corresponding to another two sides of the first vacuum transfer chamber 11. Further, a delivery chamber 5 through which the wafer W is transferred between the first vacuum transfer chamber 11 and a second vacuum transfer chamber 21 to be described later is connected to a wall corresponding to the other side of the first vacuum transfer chamber 1 between the degas chambers 5a and 5b of the first vacuum transfer chamber 11.

The Mn film forming apparatuses 12a and 12b, the Ru liner film forming apparatuses 14a and 14b, the degas chambers 5a and 5b, and the delivery chamber 5 are connected to the respective sides of the first vacuum transfer chamber 11 via gate valves G. They communicate with the first vacuum transfer chamber 11 by opening the corresponding gate valves G and are isolated from the first vacuum transfer chamber 11 by closing the corresponding gate valves G.

The inner space of the first vacuum transfer chamber 11 is maintained at a predetermined vacuum atmosphere. Provided in the first vacuum transfer chamber 11 is a first transfer mechanism 16 for loading and unloading the wafer W into and from the Mn film forming apparatuses 12a and 12b, the Ru liner film forming apparatuses 14a and 14b, the degas chambers 5a and 5b, and the delivery chamber 5. The first transfer mechanism 16 is disposed substantially at the center of the first vacuum transfer chamber 11, and has a rotatable and extensible/contractible portion 17. The rotatable and extensible/contractible portion 17 has two support arms 18a and 18b for supporting the wafer W at leading ends thereof. The two support arms 18a and 18b are attached to the rotatable and extensible/contractible portion 17 to be directed in the opposite directions.

The second processing unit 3 includes: a second vacuum transfer chamber 21 having a heptagonal cross section; and two Cu film forming apparatuses 22a and 22b connected to walls corresponding to two opposite sides of the second vacuum transfer chamber 21, each for filling recesses such as a trench, a via and the like. The Cu film forming apparatuses 22a and 22b may be used for consecutively performing a series of operations from the filling of the recess to the formation of laminated portions beyond the upper end of the recess. Alternatively, the Cu film forming apparatuses 22a and 22b may be used only for the filling, and the laminated portions may be formed by a plating process.

The degas chambers 5a and 5b are connected to walls corresponding to another two sides of the second vacuum transfer chamber 21, which face the first processing unit 2, and the delivery chamber 5 is connected to a wall corresponding to a side of the second vacuum transfer chamber 21 between the degas chambers 5a and 5b. In other words, the delivery chamber 5 and the degas chambers 5a and 5b are provided between the first vacuum transfer chamber 11 and the second vacuum transfer chamber 21, and the degas chambers 5a and 5b are disposed at both sides of the delivery chamber 5. Moreover, load-lock chambers 6a and 6b, which allow the atmospheric transfer and the vacuum transfer, are connected to respective walls corresponding to two sides of the second vacuum transfer chamber 21, which face the loading/unloading unit 4.

The Cu film forming apparatuses 22a and 22b, the degas chambers 5a and 5b, and the load-lock chambers 6a and 6b are connected to the respective sides of the second vacuum transfer chamber 21 via gate valves G. They communicate with the second vacuum transfer chamber 21 by opening the corresponding gate valves G and are isolated from the second vacuum transfer chamber 21 by closing the corresponding gate valves G. The delivery chamber 5 is connected to the second transfer chamber 21 without providing a gate valve therebetween.

The inner space of the second vacuum transfer chamber 21 is maintained at a predetermined vacuum atmosphere. Provided in the second vacuum transfer chamber 21 is a second transfer mechanism 26 for loading and unloading the wafer W into and from the Cu film forming apparatuses 22a and 22b, the degas chambers 5a and 5b, the load-lock chambers 6a and 6b and the delivery chamber 5. The second transfer mechanism 26 is disposed substantially at the center of the second vacuum transfer chamber 21, and has a rotatable and extensible/contractible portion 27. The rotatable and extensible/contractible portion 27 has two support arms 28a and 28b for supporting the wafer W at leading ends thereof. The two support arms 28a and 28b are attached to the rotatable and extensible/contractible portion 27 to be directed in the opposite directions.

The loading/unloading unit 4 has an atmospheric transfer chamber 31 connected to the load-lock chambers 6a and 6b, and is provided at the side of the load-lock chambers 6a and 6b opposite to the second processing unit 3 with the load-lock chambers 6a and 6b between the loading/unloading unit 4 and the second processing unit 3. Gate valves G are provided at walls between the load-lock chambers 6a and 6b and the atmospheric transfer chamber 31. Provided at a wall of the atmospheric transfer chamber 31 opposite to the wall connected to the load-lock chambers 6a and 6b are two connecting ports 32 and 33 each for connecting carriers C accommodating therein wafers W as target substrates. Each of the connecting ports 32 and 33 is provided with a shutter (not shown). When the carrier C that is either empty or accommodates therein wafers W is directly mounted therein, the shutter is opened and the inner space of the carrier C communicates with that of the atmospheric transfer chamber 31 while preventing intrusion of air from outside.

Further, an alignment chamber 34 is provided at a side of the atmospheric transfer chamber 31, and the alignment of the wafer W is performed therein. Provided in the atmospheric transfer chamber 31 is an atmospheric transfer mechanism 36 for loading and unloading the wafer W into and from the carrier C and the load-lock chambers 6a and 6b. The atmospheric transfer mechanism 36 has two multi-joint arms and can move on a rail 38 along the arrangement direction of the carriers C. Therefore, the atmospheric transfer mechanism 36 performs the transfer of wafers while mounting the wafer W on hands 37 provided at leading ends of the respective arms.

The CMP processing part 103 includes a CMP apparatus, a transfer device thereof, or the like.

As shown in FIG. 11, a controller 104 includes a process controller 41 having a microprocessor (computer) for controlling the respective components of the surface treatment part 101, the film forming part 102 and the CMP processing part 103, and further includes a user interface 42 and a storage unit 43. The user interface 42 includes a keyboard through which an operator performs a command input to manage the film forming system 100, a display for visually displaying the operational states of the film forming system 100, and the like. The storage unit 43 stores therein control programs to be used in realizing various processes performed by the film forming system 100 under the control of the process controller 41, programs, i.e., recipes, to be used in operating the respective components of the processing (treatment) apparatuses to carry out processes under processing conditions and various data. The user interface 42 and the storage unit 43 are connected to the process controller 41.

The recipes are stored in a storage medium 43a inside the storage unit 43. The storage medium 43a may be a hard disk or a portable medium such as a CD-ROM, a DVD, a flash memory or the like. Alternatively, the recipes may be suitably transmitted from other devices via, e.g., a dedicated transmission line.

If necessary, a recipe is read out from the storage unit 43 under the instruction from the user interface 42 and is executed by the process controller 41. Accordingly, a desired process is performed in the film forming system 100 under the control of the process controller 41.

In such a film forming system 100, the carrier C accommodating therein the etched and ached wafer is transferred to the surface treatment part 101, and the wafer is subjected to the surface treatment for forming a hydrophilic surface.

The carrier C accommodating therein the wafer that has been subjected to the surface treatment is transferred to the film forming part 102. Next, the wafer W having recesses such as a trench, a via and the like in a predetermined pattern is unloaded from the carrier C and loaded into the load-lock chamber 6a or 6b by the atmospheric transfer mechanism 36. After the pressure in the corresponding load-lock chamber is decreased to a vacuum level equivalent to that in the second transfer chamber 21, the wafer W is unloaded from the corresponding load-lock chamber to be loaded into the degas chamber 5a or 5b through the second vacuum transfer chamber 21 by the second transfer mechanism 26. Thus, the wafer W is subjected to the degas process.

Thereafter, the wafer W is unloaded from the corresponding degas chamber to be loaded into the Mn film forming apparatus 12a or 12b through the first vacuum transfer chamber 11 by the first transfer mechanism 16. Thus, the Mn film for forming a self-aligned barrier film as described above is formed.

After the Mn film is formed, the wafer W is unloaded from the Mn film forming apparatus 12a or 12b to be loaded into the Ru liner film forming apparatus 14a or 14b by the first transfer mechanism 16. Thus, the Ru liner film as described above is formed.

After the Ru liner film is formed, the wafer W is unloaded from the Ru liner film forming apparatus 14a or 14b and transferred into the delivery chamber 5 by the first transfer mechanism 16. Thereafter, the wafer W is unloaded from the delivery chamber 5 to be loaded into the Cu film forming apparatus 22a or 22b through the second vacuum transfer chamber 21 by the second transfer mechanism 26. Thus, the Cu film is formed, and Cu is filled into the recesses such as a trench, a via and the like. At this time, the formation of the laminated portions beyond the upper end of the recess may be integrally and consecutively performed. However, it is also possible to allow the Cu film forming apparatus 22a or 22b to perform only the filling of the recess and, then, form the laminated portions beyond the upper end of the recess by a plating process.

After the Cu film is formed, the wafer W is transferred into the load-lock chamber 6a or 6b. After the pressure in the corresponding load-lock chamber is returned to the atmospheric pressure, the wafer W having the Cu film is unloaded by the atmospheric transfer mechanism 36 and returned to the carrier C. These processes are repeated for the number of wafers W in the carrier.

After the completion of the film formation, the carrier C is transferred to the CMP processing part 103. Thus, the CMP processing is performed.

In accordance with the film forming system 100, the surface treatment, the film forming process, and the CMP processing can be integrally performed on the etched/ashed wafer. Further, through the film forming part 102, the Mn film forming a self-aligned barrier film, the Ru liner film, and the Cu film are formed in the vacuum without exposing to the atmosphere. Therefore, oxidation on the interfaces of the films can be avoided, and a high-performance Cu wiring can be obtained.

In addition, when the laminated portion (layer) is formed by a Cu plating process, the wafer W is unloaded after the Cu film is formed.

<Cu Film Forming Apparatus>

Figure 12:
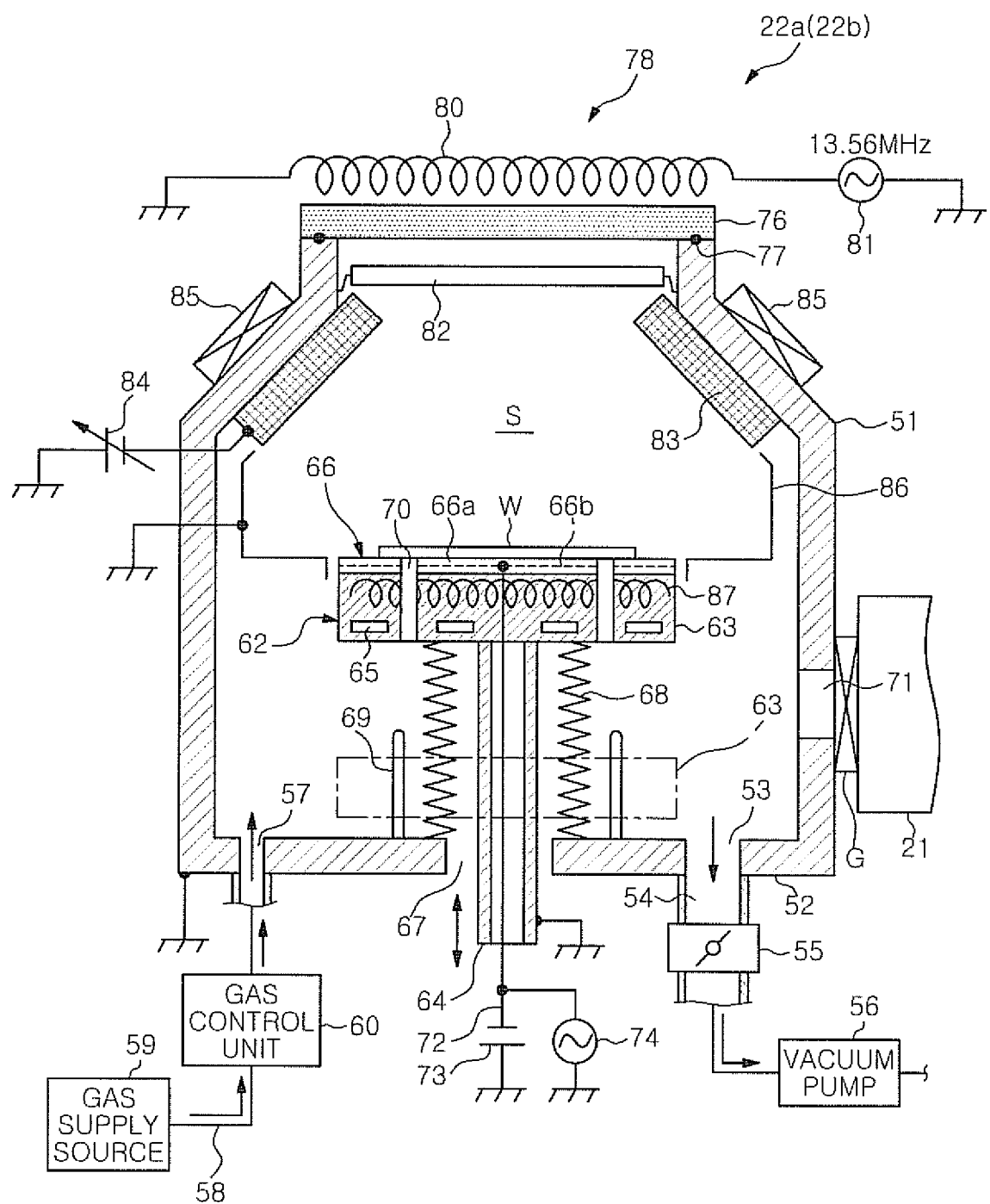
FIG. 12 is a cross sectional view showing a Cu film forming apparatus for forming a Cu film, which is installed in the film forming part shown in FIG. 10.

Hereinafter, a preferred example of the Cu film forming apparatus 22a (22b) for forming a Cu film will be described. FIG. 12 is a cross sectional view showing an example of the Cu film forming apparatus.

Here, an inductively coupled plasma (ICP) type plasma sputtering apparatus that is an iPVD apparatus will be described as an example of the Cu film forming apparatus.

As shown in FIG. 12, the Cu film forming apparatus 22a (22b) includes a cylindrical processing chamber 51 made of, e.g., aluminum or the like. The processing chamber 51 is grounded, and a gas exhaust port 53 is provided at a bottom portion 52 thereof. A gas exhaust line 54 is connected to the gas exhaust port 53. A throttle valve 55 and a vacuum pump 56 for controlling a pressure are connected to the gas exhaust line 54, and thus the inner space of the processing chamber 51 can be evacuated to vacuum. Further, a gas inlet port 57 for introducing a predetermined gas into the processing chamber 51 is provided at the bottom portion 52 of the processing chamber 51. The gas inlet port 57 is connected to a gas supply line 58, and the gas supply line 58 is connected to a gas supply source 59 for supplying a rare gas serving as a plasma excitation gas, e.g., Ar gas, or another required gas, e.g., $N_2$ gas. The gas supply line 58 is provided with a gas control unit 60 having a gas flow rate controller, a valve and the like.

Provided in the processing chamber 51 is a mounting mechanism 62 for mounting thereon a wafer W as a target substrate. The mounting mechanism 62 has a circular plate-shaped mounting table 63, and a hollow cylindrical column 64, which is grounded, for supporting the mounting table 63. The mounting table 63 is made of a conductive material, e.g., an aluminum alloy or the like, and is grounded via the column 64. The mounting table 63 has therein a cooling jacket 65 through which a coolant is supplied via a coolant path (not shown). Further, in the mounting table 63, a resistance heater 87 coated with an insulating material is provided above the cooling jacket 65. The resistance heater 87 is electrically powered by a power supply (not shown). The mounting table 63 is provided with a thermocouple (not shown), so that the wafer can be controlled to be maintained at a predetermined temperature by controlling a supply of coolant to the cooling jacket 65 and a supply of power to the resistance heater 87 based on the temperature detected by the thermocouple.

Provided on the top surface of the mounting table 63 is a thin circular plate-shaped electrostatic chuck 66 in which an electrode 66b is embedded in a dielectric member 66a made of, e.g., alumina or the like. Accordingly, the wafer W can be electrostatically attracted and held by electrostatic force. The lower portion of the column 64 extends downward through an insertion through hole 67 formed at the center of the bottom portion 52 of the processing chamber 51. The column 64 is vertically movable by an elevation unit (not shown), so that the entire mounting mechanism 62 is vertically moved.

An extensible/contractible metal bellows 68 is provided to surround the column 64. The metal bellows 68 has an upper end hermetically attached to the bottom surface of the mounting table 63 and a lower end hermetically attached to the top surface of the bottom portion 52 of the processing chamber 51. Accordingly, the mounting mechanism 62 can be vertically moved while maintaining the airtightness in the processing chamber 51.

A plurality of, e.g., three (only two are shown in FIG. 12) support pins 69 is uprightly mounted on the bottom portion 52 toward the up side, and pin insertion through holes 70 are formed in the mounting table 63 so as to correspond to the support pins 69. Therefore, when the mounting table 63 is lowered, the upper end portions of the support pins 69 pass through the pin insertion through holes and receive the wafer W, so that the wafer W is transferred to a transfer arm (not shown), which comes from the outside. Therefore, a loading/unloading opening 71 through which the transfer arm moves in and out is provided at a lower sidewall of the processing chamber 51, and an openable/closeable gate valve G is provided at the loading/unloading opening 71. The second vacuum transfer chamber 21 is provided on the side of the gate valve G opposite to the processing chamber 51.

A power supply 73 for the electrostatic chuck 66 is connected to the electrode 66b of the electrostatic chuck 66 through a power supply line 72. By applying a DC voltage from the power supply 73 to the electrode 66b, the wafer W is electrostatically attracted and held by electrostatic force. Further, a high frequency bias power supply 74 is connected to the power supply line 72, so that a high frequency bias power is applied to the electrode 66b of the electrostatic chuck 66 through the power supply line 72 to apply a bias power to the wafer W. The frequency of the high frequency power is preferably in a range from about 400 kHz to 60 MHz, e.g., about 13.56 MHz.

A high frequency transmission plate 76 made of a dielectric material, e.g., alumina or the like, is hermetically provided at the ceiling portion of the processing chamber 51 via a seal member 77 such as an O-ring or the like. Further, a plasma generating source 78, for generating a plasma from a rare gas as a plasma excitation gas, e.g., Ar gas, in a processing space S of the processing chamber 51, is provided above the transmission plate 76. The plasma excitation gas may be another rare gas, e.g., He, Ne, Kr or the like, other than Ar.

The plasma generating source 78 has an induction coil 80 disposed so as to correspond to the transmission plate 76. A high frequency power supply 81 having a high frequency of, e.g., 13.56 MHz for plasma generation is connected to the induction coil 80, so that a high frequency power is introduced into the processing space S through the transmission plate 76 and an induced electric field is formed.

Moreover, a baffle plate 82 made of e.g. aluminum, is provided directly under the transmission plate 76 to diffuse the introduced high frequency power. Further, disposed below the baffle plate 82 to surround the upper region of the processing space S is a target 83 formed of Cu having an annular shape with an inwardly upwardly inclined cross section (truncated cone shape), for example. A variable-voltage DC power supply 84 is connected to the target 83 in order to apply a DC power for attracting Ar ions. Alternatively, an AC power supply may be used instead of the DC power supply.

Further, a magnet 85 is provided at the outer circumferential side of the target 83 to apply a magnetic field to the target 83. The target 83 is sputtered by Ar ions in the plasma so that Cu atoms or Cu atomic groups are emitted from the target 83 and they are mostly ionized while passing through the plasma.

Moreover, a cylindrical protection cover member 86 made of, e.g., aluminum or copper, is provided under the target 83 to surround the processing space S. The protection cover member 86 is grounded and a lower portion thereof is bent inward so as to be positioned near the side portion of the mounting table 63. Thus, an inner end of the protection cover member 86 is disposed to surround the outer peripheral side of the mounting table 63.

In the Cu film forming apparatus configured as described above, the wafer W is loaded into the processing chamber 51 shown in FIG. 12 and mounted on the mounting table 63. Then, the wafer W is electrostatically attracted to and held on the electrostatic chuck 66, and the following processes are carried out under the control of the controller 104. At this time, the temperature of the mounting table 63 is controlled by controlling the supply of coolant to the cooling jacket or the supply of power to the resistance heater 87 based on the temperature detected by the thermocouple (not shown).

First, the processing chamber 51 is set to be maintained at a predetermined vacuum state by operating the vacuum pump 56. Then, Ar gas is supplied to the processing chamber 51 at a predetermined flow rate by controlling the gas control unit 60, and at the same time, the processing chamber 51 is maintained at a predetermined vacuum level by controlling the throttle valve 55. Next, a DC power is applied to the target 83 from the variable DC power supply 84, and a high frequency power (plasma power) is supplied to the induction coil 80 from the high frequency power supply 81. Further, a predetermined high frequency bias power is supplied to the electrode 66b of the electrostatic chuck 66 from the high frequency bias power supply 74.

Accordingly, in the processing chamber 51, an Ar plasma is generated by the high frequency power supplied to the induction coil 80 and thus Ar ions are generated. These ions are attracted toward the target 83 by the DC voltage applied to the target 83 and collide with the target 83. Hence, the target 83 is sputtered to emit particles. At this time, the amount of particles emitted from the target 83 is optimally controlled by the DC voltage applied to the target 83.

The particles emitted from the sputtering target 83 are mostly ionized while passing through the plasma. Here, the particles emitted from the target 83 are scattered downward in a state where ionized ions and electrically neutral atoms are mixed. Particularly, when the pressure in the processing chamber 51 is increased to a certain level, a plasma density is increased so that the particles can be ionized with high efficiency. The ionization rate at this time is controlled by the high frequency power supplied from the high frequency power supply 81.

When the ions are introduced into an ion sheath region formed on the wafer W with a thickness of about a few mm by the high frequency bias power applied to the electrode 66b of the electrostatic chuck 66 from the high frequency bias power supply 74, the ions are rapidly attracted with strong directivity toward the wafer W and deposited on the wafer W. As a consequence, the Cu thin film is formed.

At this time, the wafer temperature is set to be maintained at a high level in a range from 65° C. to 350° C., and the bias power applied from the high frequency bias power supply 74 to the electrode 66b of the electrostatic chuck 66 is controlled. With such control, the film formation using Cu and the etching using Ar are controlled to improve the mobility of Cu. As a result, Cu can be filled with good fillability even in a trench or a hole having a small opening.

In view of ensuring good fillability, the pressure in the processing chamber 51 (processing pressure) is preferably set in a range from 1 mTorr to 100 mTorr (from 0.133 Pa to 13.3 Pa) and more preferably set in a range from 35 mTorr to 90 mTorr (from 4.66 Pa to 12.0 Pa). Further, the DC power supplied to the target is preferably set in a range from 4 kW to 12 kW and more preferably in a range from 6 kW to 10 kW.

Further, when the opening of the trench or the hole is large, the film formation can be carried out by setting the wafer temperature to a low level in a range from −50° C. to 0° C. and further decreasing the pressure in the processing chamber 51. Accordingly, the film forming rate can be increased. In this case, the film forming method is not limited to the iPVD, and the conventional PVD such as the conventional sputtering, the ion plating or the like can be employed.

<Mn Film Forming Apparatus>

Figure 13:
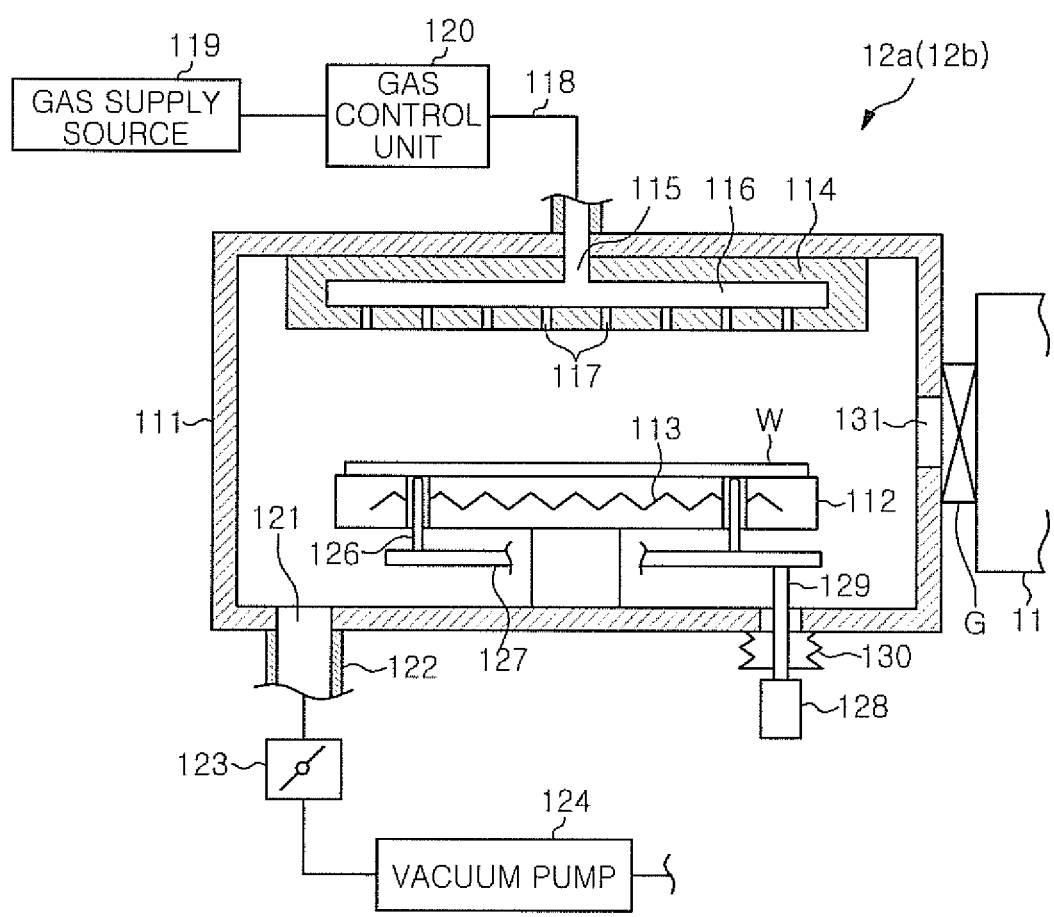
FIG. 13 is a cross sectional view showing a Mn film forming apparatus for forming a Mn film, which is installed in the film forming part shown in FIG. 10.

Hereinafter, a Mn film forming apparatus 12a (12b) for forming a Mn film will be described. The Mn film may be preferably formed by a thermal CVD. FIG. 13 is a cross sectional view showing an example of the Mn film forming apparatus for forming a Mn film by the thermal CVD.

As shown in FIG. 13, the Mn film forming apparatus 12a (12b) includes a cylindrical processing chamber 111 made of, e.g., aluminum or the like. The processing chamber 111 has therein a mounting table 112 made of ceramic, e.g., AlN, for mounting thereon the wafer W, and the mounting table 112 has therein a heater 113. The heater 113 generates a heat by a power supplied from a heater supply (not shown).

A shower head 114 is provided on the ceiling wall of the processing chamber 111 so as to face the mounting table 112. Through the shower head 114, a purge gas or a processing gas for forming a Mn film is introduced into the processing chamber 111 in the form of shower. The shower head 114 has a gas inlet port 115 at an upper portion thereof and a gas diffusion space 116 therein. A plurality of gas injection openings 117 is formed in the bottom of the shower head 114. A gas supply line 118 is connected to the gas inlet port 115, and a gas supply source 119 is connected to the gas supply line 118 in order to supply the purge gas or the processing gas for forming the Mn film. Further, a gas control unit 120 including a gas flow rate controller, a valve or the like is disposed on the gas supply line 118. As described above, decacarbonyldimanganese ($Mn_2(CO)_{10}$) may be preferably used as a Mn forming gas. The Mn film can be formed by thermally decomposing decacarbonyldimanganese.

A gas exhaust port 121 is provided in the bottom portion of the processing chamber 111, and a gas exhaust line 122 is connected to the gas exhaust port 121. A throttle valve 123 and a vacuum pump 124 for the pressure control are connected to the gas exhaust line 122, so that the processing chamber 111 can be exhausted to vacuum.

Three wafer support pins 126 (only two pins are shown) for transferring a wafer are provided in the mounting table 112 such that they can protrude from and retreat into the surface of the mounting table 112. The wafer support pins 126 are fixed to a support plate 127. The wafer support pins 126 are vertically moved together with the support plate 127 by vertically moving a rod 129 by a driving unit 128 such as an air cylinder or the like. Reference numeral 130 denotes a bellows. A wafer loading/unloading opening 131 is formed at a sidewall of the processing chamber 111, so that a wafer W can be loaded from and unloaded into the first vacuum transfer chamber 11 in a state where a gate valve G is opened.

In the Mn film forming apparatus 12a (12b), the gate valve G is opened and the wafer W is mounted on the mounting table 112. Then, the gate valve G is closed, and the processing chamber 111 is evacuated by the vacuum pump 124 to control the pressure in the processing chamber 111 to be maintained at a predetermined level. In a state where the wafer W is heated to a predetermined temperature through the mounting table 112 by the heater 113, a processing gas such as decacarbonyldimanganese ($Mn_2(CO)_{10}$) or the like is introduced into the processing chamber 111 from the gas supply source 119 through the gas supply line 118 and the shower head 114. Accordingly, the reaction of the processing gas is performed on the surface of the wafer W, and the Mn film is formed on the wafer W.

The Mn film may be formed by using another film forming material other than the aforementioned manganese carbonyl.

<Ru Liner Film Forming Apparatus>

The Mn film forming apparatus shown in FIG. 13 may be used as the Ru liner film forming apparatus 14a (14b) only by changing the film forming gas to, e.g., ruthenium carbonyl ($Ru_3(CO)_{12}$). Accordingly, the formation of the Ru liner film by the thermal CVD can be realized by thermally decomposing the ruthenium carbonyl. The Ru liner film can also be formed by the same apparatus using another CVD source as described above.

Further, the Ru liner film may be formed by the PVD. However, in order to obtain good step coverage and reduce the amount of impurities in the film, it is preferable to perform the film formation by the CVD using ruthenium carbonyl.

<Other Application>

While the embodiment of the present invention have been described, the present invention may be variously modified without being limited to the above embodiment. For example, the film forming part is not limited to the type shown in FIG. 10, and may be of a type in which all the film forming apparatuses are connected to a single transfer unit. Further, instead of the multi-chamber type film forming apparatus shown in FIG. 10, a film forming apparatus may be employed in which some of a Mn film, a Ru liner film, and a Cu film are formed in the same film forming apparatus and the other films are formed in separate apparatuses through the exposure to the atmosphere. Alternatively, the respective films may be formed in separate apparatuses through the exposure to the atmosphere.

The above embodiments have described the example in which the method of the present invention is applied to a wafer having a trench and a via (hole). However, the present invention may be applied to the case in which the wafer has only a trench or the case in which the wafer has only a hole. Moreover, the present invention may be applied to filling in devices having various structures such as a single damascene structure, a double damascene structure, a 3D mounting structure or the like. Further, although a semiconductor wafer has been described as an example of a substrate to be processed in the above embodiment, the semiconductor wafer includes a compound semiconductor such as GaAs, SiC, GaN or the like as well as a silicon substrate, and the present invention may be applied to a glass substrate for use in FPD (Flat Panel Display) such as a liquid display device or the like, a ceramic substrate or the like without being limited to a semiconductor wafer.

In accordance with the embodiment of the present invention, it is possible to ensure good fillability and realize low resistance of a Cu wiring by forming a CVD-Mn film capable of forming a barrier film, e.g., a self-aligned barrier, in a recess by reaction with an underlying Si-containing film and filling the recess with Cu by the PVD.

While the invention has been shown and described with respect to the embodiments, it will be understood by those skilled in the art that various changes and modification may be made without departing from the scope of the invention as defined in the following claims.

What is claimed is:

1. A Cu wiring forming method for forming a Cu wiring by filling Cu in a recess formed in a predetermined pattern in a Si-containing interlayer insulating film, of a substrate, the Cu wiring forming method comprising:

forming an NH group only on a surface of the Si-containing interlayer insulating film such that the surface of the Si-containing interlayer insulating film becomes hydrophilic;

forming a Mn film, which becomes a self-aligned barrier film by reaction with an underlying base, at least on a surface of the recess by chemical vapor deposition;

forming a Cu film by physical vapor deposition to fill the recess with the Cu film; and forming a Cu wiring in the recess by polishing the entire surface of the substrate by chemical mechanical polishing, wherein the Cu wiring forming method further comprises, between said forming the NH group and said forming the Mn film, forming an OH group or a H group on the surface of the Si-containing interlayer insulating film.

2. The Cu wiring forming method of claim 1, further comprising, forming a Ru film between said forming the Mn film and said forming the Cu film.

3. The Cu wiring forming method of claim 2, wherein the Ru film is formed by chemical vapor deposition.

4. The Cu wiring forming method of claim 1, wherein said forming the Cu film is carried out by an apparatus configured to produce a plasma from a plasma generating gas in a processing chamber where the substrate is accommodated, scatter particles from a Cu target, ionize particles in the plasma, and attract ions onto the substrate by applying a bias power to the substrate.

5. The Cu wiring forming method of claim 1, wherein said forming the NH group is carried out by performing $N_2$ plasma treatment.

* * * * *